(12) United States Patent
Medra et al.

(10) Patent No.: US 11,888,453 B2
(45) Date of Patent: Jan. 30, 2024

(54) WIDEBAND LOW-NOISE AMPLIFIER

(71) Applicant: QUALCOMM Incorporated, San Diego, CA (US)

(72) Inventors: Alaaeldien Mohamed Abdelrazek Medra, San Diego, CA (US); Francesco Gatta, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 381 days.

(21) Appl. No.: 17/210,416

(22) Filed: Mar. 23, 2021

(65) Prior Publication Data

US 2022/0311391 A1    Sep. 29, 2022

(51) Int. Cl.
*H03F 1/22* (2006.01)
*H03F 3/19* (2006.01)

(52) U.S. Cl.
CPC ......... *H03F 3/19* (2013.01); *H03F 2200/294* (2013.01); *H03F 2200/372* (2013.01); *H03F 2200/534* (2013.01); *H03F 2200/541* (2013.01)

(58) Field of Classification Search
CPC ............... H03F 3/19; H03F 2200/294; H03F 2200/372; H03F 1/347; H03F 2200/444; H03F 2200/489; H03F 2200/492; H03F 2200/534; H03F 2200/541; H03F 2200/61; H03F 2200/75; H03F 3/195; H03F 1/565; H03F 2200/222; H03F 2200/387; H03F 2200/451; H03F 2200/72; H03F 3/45179; H03F 3/193; H03F 1/26; H03F 1/342; H03G 1/0029; H03G 3/001

USPC ................................. 330/79, 165, 188, 195
See application file for complete search history.

(56) References Cited

U.S. PATENT DOCUMENTS

| | | | |
|---|---|---|---|
| 8,446,217 B2 * | 5/2013 | Bagga | H03F 1/347 330/195 |
| 10,110,176 B2 | 10/2018 | Watanabe et al. | |
| 10,211,795 B2 * | 2/2019 | Wallis | H03F 1/523 |
| 10,530,314 B2 * | 1/2020 | Medra | H04B 1/006 |
| 10,903,805 B2 * | 1/2021 | Bagga | H03F 1/347 |
| 10,944,441 B2 * | 3/2021 | Medra | H04B 1/16 |
| 11,205,998 B2 * | 12/2021 | Kong | H03F 1/565 |
| 2019/0356280 A1 | 11/2019 | Bagga et al. | |
| 2019/0372533 A1 | 12/2019 | Huang et al. | |
| 2020/0144978 A1 | 5/2020 | Park et al. | |
| 2020/0366325 A1 | 11/2020 | Medra et al. | |

OTHER PUBLICATIONS

Chen "A Wideband LNA Based on Current-Reused CS-CS Topology and Gm-Boosting Technique for 5G Application", 2019 IEEE Asia-Pacific Microwave Conference (APMC), pp. 1158-1160.

(Continued)

*Primary Examiner* — Khanh V Nguyen
(74) *Attorney, Agent, or Firm* — QUALCOMM Incorporated

(57) ABSTRACT

A wideband amplifier includes a first stage and a second stage. The first stage includes a transconductance transistor driven by an input signal through an input transformer. The transconductance transistor couples to a cascode transistor forming an output node for the first stage. The second stage couples the output node from the first stage through an output transformer to drive an output transistor.

30 Claims, 7 Drawing Sheets

(56) References Cited

OTHER PUBLICATIONS

Gao L., et al., "A 22-44-GHz Phased-Array Receive Beamformer in 45-nm CMOS SOI for 5G Applications With 3-3.6-dB NF", IEEE Transactions on Microwave Theory and Techniques, IEEE, USA, vol. 68, No. 11, Nov. 1, 2020, XP011817640, pp. 4765-4774.
International Search Report and Written Opinion—PCT/US2022/019405—ISA/EPO—Jun. 23, 2022.
Li C-Y., et al., "A 5-11 GHz Wideband Low Noise Amplifier Using Transformer Feedback Technique", 2017 Progress In Electromagnetics Research Symposium—Spring (PIERS), IEEE, May 22, 2017, XP033301024, pp. 1039-1042.
Liang C-J., et al., "A Tri (K/Ka/V)—Band Monolithic CMOS Low Noise Amplifier with Shared Signal Path and Variable Gains", 2020 IEEE/MTT-S International Microwave Symposium (IMS), IEEE, Aug. 4, 2020, XP033839504, pp. 333-336.
Aparin V., et al., "Modified Derivative Superposition Method for Linearizing FET Low-Noise Amplifiers", IEEE Transactions on Microwave Theory and Techniques, IEEE Service Center, Piscataway, NJ, US, Feb. 1, 2005 (Feb. 1, 2005), vol. 53, No. 2, pp. 571-581, XP011126918.
Bevilacqua A., et al., "An Ultrawideband CMOS Low-Noise Amplifier for 3.1-10.6-GHz Wireless Receivers", IEEE Journal of Solid-State Circuits, Dec. 2004, vol. 39, No. 12, pp. 2259-2268.
Bode H.W., "Network Analysis and Feedback Amplifier Design", D. Van Nostrand Co., Inc, NewYork, 1945, 7 pages.
Fabiano I., et al., "SAW-Less Analog Front-End Receivers for TDD and FDD," IEEE Journal of Solid-State Circuits, Dec. 2013, vol. 48, No. 12, pp. 3067-3079.
Fano R.M., "Theoretical Limitations on the Broadband Matching of Arbitrary Impedances", Journal of the Franklin Institute, vol. 249, Jan.-Feb. 1950, pp. 57-83.
Gao L., et al., "A 24-43 GHz LNA with 3.1-3.7 dB Noise Figure and Embedded 3-Pole Elliptic High-Pass Response for 5G Applications in 22 nm FDSOI", IEEE Radio Frequency Integrated Circuits Symposium (RFIC), Boston, MA, USA, Jun. 2019, pp. 239-242.
Ismail A., et al., "A 3-10-GHz Low-Noise Amplifier with Wideband LC-Ladder Matching Network", IEEE Journal of Solid-State Circuits, vol. 39, No. 12, Dec. 2004, pp. 2269-2277.
Li X., et al., "Gm-Boosted Common-Gate LNA and Differential Colpitts VCO/QVCO in 0.18-µm CMOS," IEEE Journal of Solid-State Circuits, vol. 40, No. 12, Dec. 2005, pp. 2609-2619.
Orchard H.J., "Loss Sensitivities in Singly and Doubly Terminated Filters", IEEE Transactions on Circuits and Systems, vol. CAS-26, No. 5, May 1979, pp. 293-297.
Qin P., et al., "Compact Wideband LNA With Gain and Input Matching Bandwidth Extensions by Transformer", IEEE Microwave and Wireless Components Letters, vol. 27, No. 7, Jul. 2017, pp. 657-659.
Reiha M.T., et al., "A 1.2 V Reactive-Feedback 3.1-10.6 GHz Ultrawideband Low-Noise Amplifier in 0.13 µm CMOS", IEEE Radio Frequency Integrated Circuits (RFIC) Symposium, Jun. 2006, San Francisco, CA, 4 pages.
Yu Y., et al., "A 54.4-90 GHz Low-Noise Amplifier in 65-nm CMOS", IEEE Journal of Solid-State Circuits, vol. 52, No. 11, Nov. 2017, pp. 2892-2904.

\* cited by examiner

Input Transformer

```
┌─────────────────────────────────────────────────────────────┐
│ driving an input node with an input signal to cause a first │
│ current to flow through a first coil coupled between the    │
│ input node and a node for a reference voltage               │──── 400
└─────────────────────────────────────────────────────────────┘
                              │
                              ▼
┌─────────────────────────────────────────────────────────────┐
│ responsive to the first current, coupling between the first │
│ coil and a second coil coupled between the input node and   │
│ a gate of a transconductance transistor, wherein the        │
│ coupling between the first coil and the second coil and the │──── 405
│ driving of the input node with the input signal causes a    │
│ second current to flow through the second coil to charge    │
│ the gate of the transconductance transistor transistor      │
└─────────────────────────────────────────────────────────────┘
                              │
                              ▼
┌─────────────────────────────────────────────────────────────┐
│ responsive to the first current, coupling between the first │
│ coil and a third coil coupled to a source of the            │
│ transconductance transistor and the node for the reference  │──── 410
│ voltage to cause a third current to flow through the third  │
│ coil                                                         │
└─────────────────────────────────────────────────────────────┘
                              │
                              ▼
┌─────────────────────────────────────────────────────────────┐
│ wherein the coupling between the first coil and the second  │
│ coil in conjunction with a capacitance of the input node    │
│ low pass filters the input signal and wherein the coupling  │
│ between the first coil and the second coil in conjunction   │──── 415
│ with a gate-to-source capacitance of the transconductance   │
│ transistor high pass filters the input signal               │
└─────────────────────────────────────────────────────────────┘
```

FIG. 4

WIDEBAND LOW-NOISE AMPLIFIER

TECHNICAL FIELD

This application relates to low-noise amplifiers, and more particularly to a wideband low-noise amplifier.

BACKGROUND

The RF signal from a receiver's antenna is typically quite weak with a correspondingly low signal-to-noise ratio. A receiver thus generally includes a low-noise amplifier to amplify the received RF signal without significantly worsening the signal-to-noise ratio with additional noise. In contrast to a power amplifier in a transmitter that delivers power to a load, a low-noise amplifier (LNA) is providing voltage (or current) gain to the received RF signal. It is desirable to provide this gain without worsening the noise figure.

A low-noise characteristic is particularly important for an LNA as the LNA is typically the first amplifier in the receiver amplifier chain. The LNA's noise contribution will thus dominate the receiver noise figure. An important factor for the LNA's noise figure is the matching of an LNA's source impedance to a desired level. But this matching is affected by the signal frequency such that achieving low-noise LNA performance across a wide operating frequency band is challenging.

SUMMARY

An amplifier is disclosed that includes: an input transformer including a first coil coupled to an input node configured to receive an input signal; a second coil, and a third coil, the second coil being coupled to the input node; a first transconductance transistor having a gate coupled to the input node through the second coil and having a source coupled to the third coil; an output transistor; an output transformer having a fourth coil coupled to a source of the output transistor; a fifth coil coupled to a gate of the output transistor; and a sixth coil coupled to a drain of the output transistor; and a first cascode transistor coupled between a drain of the first transconductance transistor and the fourth coil.

In addition, a method of amplifying an input signal is disclosed that includes: coupling an input signal through three mutually-coupled coils of an input transformer to cause a transconductance transistor to conduct a current through a cascode transistor; and conducting the current through an output transformer to produce an output signal at a drain of an output transistor.

Moreover, a first stage of an amplifier is disclosed that includes: a first transconductance transistor; a first coil coupled between an input node and a node for a reference voltage; a second coil coupled between the input node and a gate of the first transconductance transistor; a third coil coupled between a source of the first transconductance transistor and the node for the reference voltage, wherein the first coil, the second coil, and the third coil are all mutually coupled to form an input transformer; and a capacitor coupled between the input node and ground, the capacitor being configured with the second coil to form a low-pass filter, wherein the first coil and a gate-to-source capacitance of the first transconductance transistor are configured to form a high-pass filter.

Finally, a method of amplifying in a first stage of an amplifier is disclosed that includes: driving an input node with an input signal to cause a first current to flow through a first coil coupled between the input node and a node for a reference voltage; responsive to the first current, coupling between the first coil and a second coil coupled between the input node and a gate of a transconductance transistor, wherein the coupling between the first coil and the second coil and the driving of the input node with the input signal causes a second current to flow through the second coil to charge the gate of the transconductance transistor; responsive to the first current, coupling between the first coil and a third coil coupled to a source of the transconductance transistor and the node for the reference voltage to cause a third current to flow through the third coil; and wherein the coupling between the first coil and the second coil in conjunction with a capacitance of the input node low pass filters the input signal and wherein the coupling between the first coil and the second coil in conjunction with a gate-to-source capacitance of the transconductance transistor high pass filters the input signal.

These and other advantageous features may be better appreciated through the following detailed description.

BRIEF DESCRIPTION OF THE DRAWINGS

FIG. 4 is a flowchart for an example method of first stage amplification in accordance with an aspect of the disclosure.

Embodiments of the present disclosure and their advantages are best understood by referring to the detailed description that follows. It should be appreciated that like reference numerals are used to identify like elements illustrated in one or more of the figures.

DETAILED DESCRIPTION

The proliferation of frequency bands in the Frequency Range 1 (FR1) spectrum for Fifth Generation New Radio (5G NR) expands across the C band, including from 3.3 GHz to 7 GHz. There are portions of the C-band, however, that are either reserved for other applications or shared with other applications. For example, a frequency band from 4.2 GHz to 4.4 GHz is reserved for avionics applications. In addition, a frequency band that extends from approximately 5 GHz to 6 GHz is shared with WiFi networking. But the remaining portions of the C band are available to 5G. For example, 5G may use an n77 frequency band that extends from 3.3 GHz to 4.2 GHz, an n79 frequency band that extends from 4.4 GH to 5 GHz, and a remaining upper portion of the C band that extends from 5 GHz to 6 GHz.

The presence of strong jammers from WiFi traffic in the 5 to 6 GHz frequency band presents a challenge to 5G applications. In one approach, bandpass filtering may be used to reject the WiFi band, but such filtering may degrade the noise figure and output power. It is thus known to rely on co-existence managers or jammer detection instead of bandpass filtering. Given these alternative approaches to simply filtering out the 5 to 6 GHz frequency band, a 5G transceiver may need to accommodate the wide expanse of the C band. For example, a 5G receiver may need to provide low-noise amplification to a received signal that may range from the n77 band to the upper portion of the C band. It is a challenge for a low-noise amplifier to be matched (provide a desired input impedance and a desired output impedance) across such a wide frequency range.

A wideband amplifier (e.g., a low-noise amplifier) is provided that includes an input stage that advantageously matches an input impedance for the wideband amplifier to a desired input impedance value across a relatively large frequency range. Similarly, the wideband amplifier includes an output stage that advantageously matches an output impedance for the wideband amplifier to a desired output impedance value across the relatively large frequency range. Since the wideband amplifier can operate across the entire relatively large frequency range, a design of a receiver including the wideband amplifier is advantageously simplified with regard to routing from the antennas to the wideband amplifier as compared to a conventional practice of using multiple amplifiers to provide wideband performance. In addition, the routing from the wideband amplifier to a baseband modem is similarly simplified, which results in a substantial cost reduction as compared to the use of multiple amplifiers.

Figure 1A:
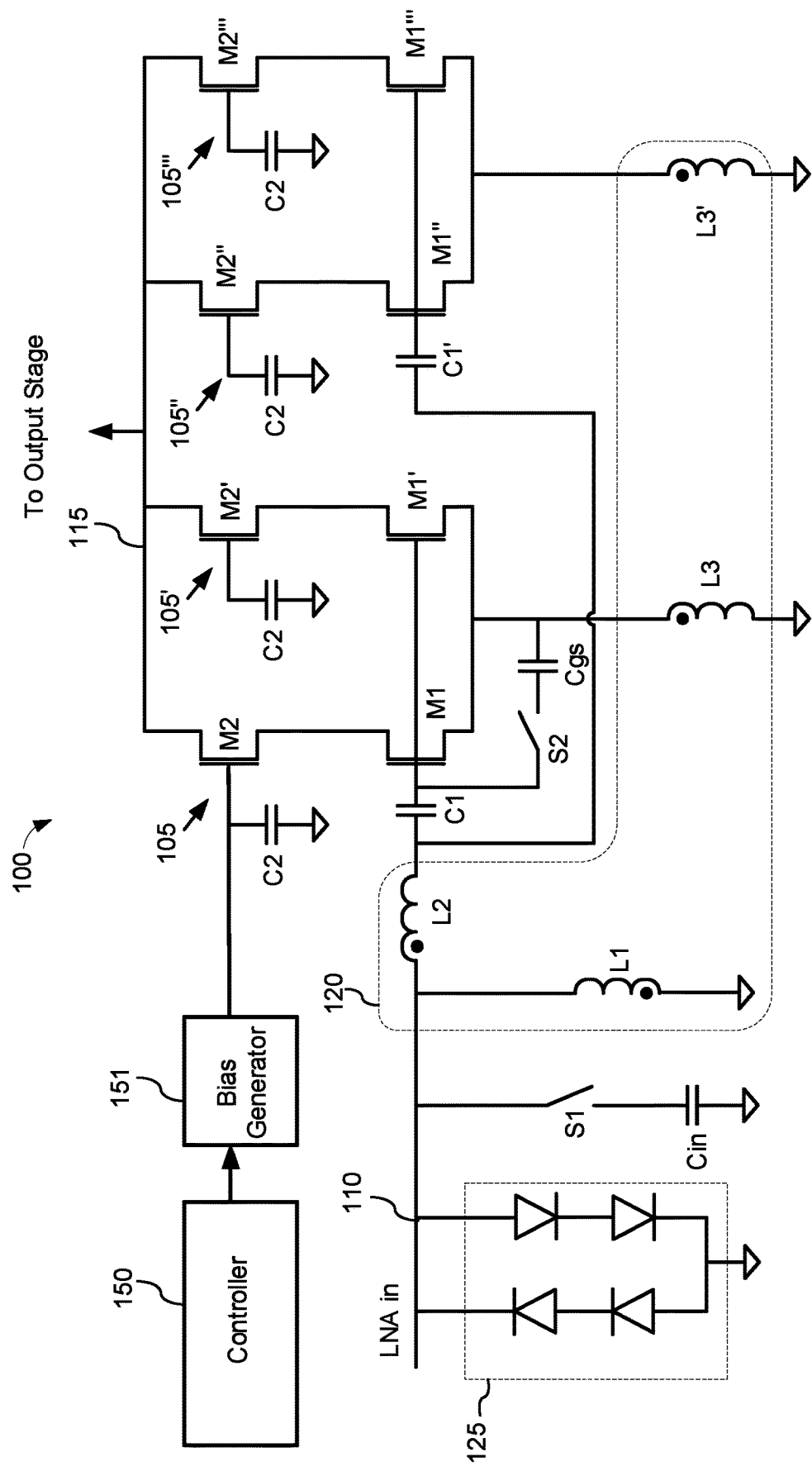
FIG. 1A illustrates a first stage of a wideband amplifier in accordance with an aspect of the disclosure.

The following discussion will assume that the frequency range serviced by the wideband amplifier is the C band such as ranging from 3.3 GHz to 7 GHz but it will be appreciated that the disclosed wideband amplifier may be readily adapted for usage in alternative frequency bands. An example input stage 100 for a wideband amplifier is shown in FIG. 1A. Input stage 100 is also denoted herein as a first stage 100. To allow for gain adaptation, input stage 100 includes several selectable branches or segments. Each branch includes its own transconductance transistor and a cascode transistor. For example, a first branch 105 includes a transconductance transistor M1 having a drain connected to a source of a cascode transistor M2. A second branch 105' has an analogous arrangement of a transconductance transistor M1' and a cascode transistor M2'. Similarly, a third branch 105" includes a transconductance transistor M1" and a cascode transistor M2". Finally, a fourth branch 105'" includes a transconductance transistor M1'" and a cascode transistor M2'". In input stage 100, the transconductance and cascode transistors are all n-type metal-oxide semiconductor (NMOS) transistors but it will be appreciated that input stage 100 is readily converted to a p-type metal-oxide semiconductor (PMOS) implementation in which the transconductance and cascode transistors are all PMOS transistors.

To activate a branch, a controller 150 controls a gate bias of the corresponding cascode transistor with a bias voltage as generated by a bias generator 151. For example, just one branch may be active in a low-gain state for first stage 100. For illustration clarity, bias generator 151 is shown as only applying a bias voltage to the gate of cascode transistor M1, but it will be appreciated that bias generator 151 biases the gate of the cascode transistor for each active branch. Similarly, bias generator 151 biases the gates of the cascode transistors in the inactive branches so that their cascode transistors are non-conducting. For example, bias generator 151 may ground the gates of the cascode transistors in the inactive branches in an NMOS implementation to prevent them from contributing to the amplification of an input signal (e.g., a received RF input signal) at an input node 110. The gate of each cascode transistor couples to ground through a corresponding capacitor C2 so that each cascode transistor gate is AC grounded. In a PMOS implementation, the inactive branches would have the gates of their cascode transistors charged to a power supply voltage as opposed to being grounded in an NMOS implementation.

The input signal drives the gate of the transconductance transistor in each of the active branches so that each active branch conducts a corresponding current depending upon the transconductance of the transconductance transistor. For example, suppose that branch 105 is active. Transconductance transistor M1 will then conduct a current that passes through cascode transistor M2 to bias an output stage (discussed further herein) at an output node 115. To provide broadband matching to a desired input impedance (e.g., 50Ω), each active branch is driven by the input signal through an input transformer 120 that includes a first coil (inductor) L1 that couples between input node 110 and a node for a fixed voltage reference such as ground. A second coil L2 couples between input node 110 and the gates of the transconductance transistors. Coils L1 and L2 are common to all the branches. A third coil for the input transformer 120 couples between a node for the fixed voltage reference such as ground and a source of each transconductance transistor. In one implementation, the source of each transconductance transistor could couple to ground through its own third coil. However, improved density may be achieved by sharing a coil across multiple branches. For example, branches 105 and 105' may both share a coil L3 that couples between the sources of transconductance transistors M1 and M1' and ground. Similarly, branches 105" and 105'" may both share a coil L3' that couples between the sources of transconductance transistors M3" and M3'" and ground. Coils L1, L2, and L3 are all mutually coupled as denoted by the dot convention shown in FIG. 1A. Similarly, coils L1, L2, and L3' are all mutually coupled as denoted by the illustrated dot convention. The sharing of the coils also extends to capacitors that provides an AC isolation from coil L2 to the gates of the transconductance transistors. For example, the gates of transconductance transistors M1 and M1' couple to the coil L2 through a gate capacitor C1. Similarly, the gates of transconductance transistors M1" and M1'" couple to the coil L2 through a gate capacitor C1'. In a PMOS embodiment for the cascode and transconductance transistors, the node for the fixed voltage reference that coils L1 and L3 couple to may comprise a node for a power supply voltage as opposed to being ground in an NMOS embodiment.

The polarity of the coils is shown by the dot convention as noted earlier. The mutual inductance coupling between coil L1 and the coil L3 increases the source degeneration for transconductance transistors M1 and M1' (when their corresponding branches are active) to increase the broadband matching to the desired input impedance. The coupling between coil L1 and coil L3' similarly increases the source degeneration for transconductance transistors M1" and M1'" when their corresponding branches are active. A common-gate coupling between coil L1 and coils L3 and L3' increases the transconductance for the active branches and further enhances the wideband matching.

The coupling between coils L1 and L2 further enhances the broadband coupling by forming a fourth order filter in conjunction with an input capacitance at input node 110 and a gate-to-source capacitance for each of the active transconductance transistors. The input capacitance controls the frequency of a higher-frequency low-pass filter pole in the frequency response of the resulting fourth order filter whereas the gate-to-source capacitance controls the frequency of a lower-frequency high-pass filter pole. To provide a broadband matching across the C-band, the higher-frequency pole frequency may approximately equal 7 GHz whereas the lower-frequency pole frequency approximately equals 3 GHz. The matching across the C-band may then be further tuned by an appropriate setting of the mutual inductance between coils L1 and L2. In one embodiment, the parasitic capacitance of electrostatic discharge (ESD) diodes 125 coupled between input node 110 and ground provide a sufficient capacitance to produce the desired frequency of the lower-frequency pole. To provide additional capacitance, an input capacitor Cin may be selectively coupled to input node 110 through a switch S1. The parasitic gate-to-source capacitance for the active transconductor transistors may provide a sufficient capacitance to give the desired frequency of the higher-frequency pole. However, in some embodiments, a Cgs capacitor may be selectively coupled across the gate and source of the active transconductance transistors through the closing of a switch S2. Controller 150 may also control the operation of switches S1 and S2 in such embodiments. For illustration clarity, a single capacitor Cgs is shown coupled to the coil L3 but it will be appreciated that another capacitor Cgs may be provided to couple to the coil L3'. With regard to the broadband matching, it may be shown that an input impedance for first stage 100 equals a product of the transconductance of transistor M1 with the inductance of coil L3 divided by the gate-to-source capacitance Cgs (either from transistor M1 alone or in conjunction with a Cgs capacitor). By an appropriate adjustment of these input impedance factors, a wide-band matching may be achieved to produce a desired input impedance such as 50Ω.

Figure 1B:
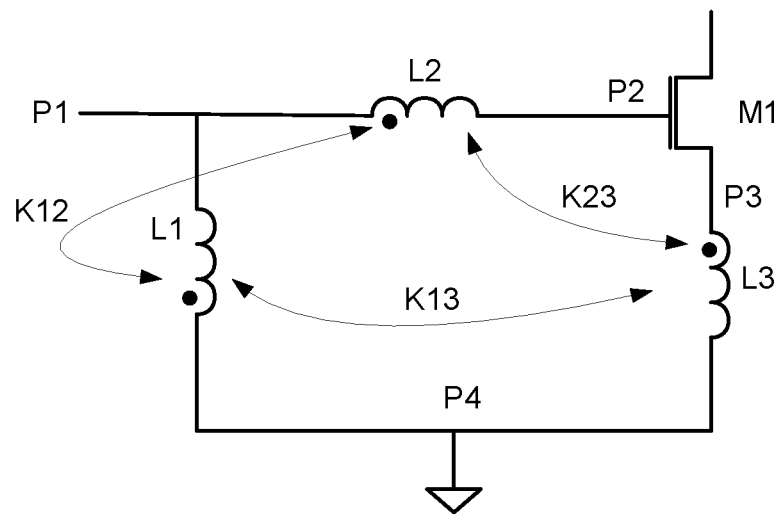
FIG. 1B illustrates a terminal labeling and the mutual inductances of the input transformer in the first stage of FIG. 1A in accordance with an aspect of the disclosure.
Figure 1C:
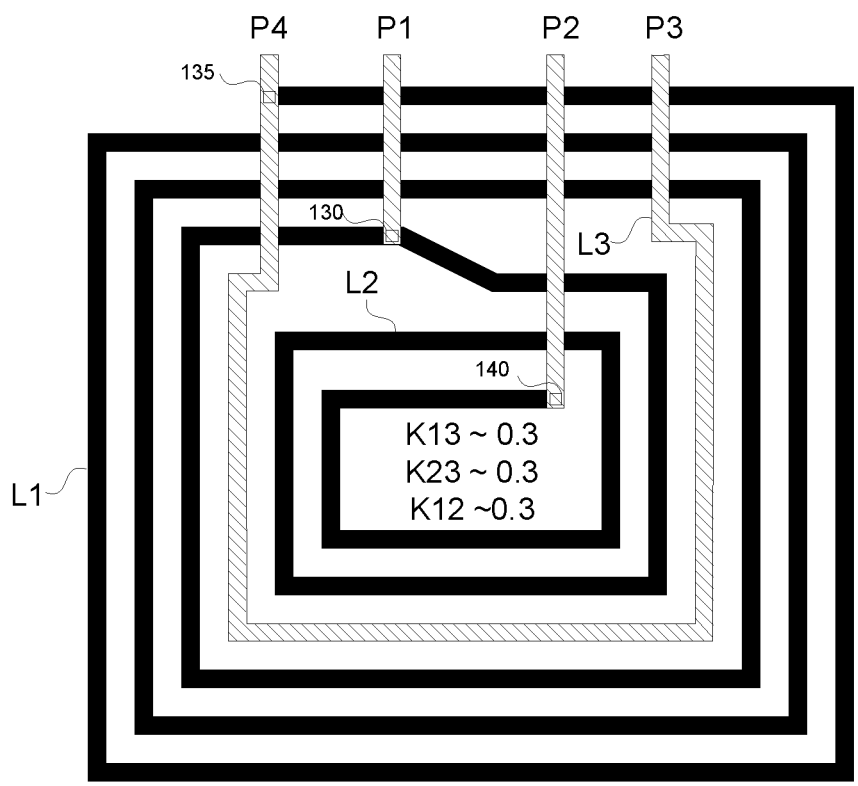
FIG. 1C illustrates a metal layer routing for the coils in the input transformer of FIG. 1A in accordance with an aspect of the disclosure.

To conserve die space, input transformer 120 may be formed through concentric coils formed in metal layers adjacent a semiconductor die in which first stage 100 is integrated. With regard to this coil arrangement, a set of terminals P1, P2, P3, and P4 to coils L1, L2, and L3 may be labelled as shown in FIG. 1B. A resulting metal-layer coil arrangement for input transformer 120 may be as shown in FIG. 1C. Coils L1 and L2 are formed in one metal layer shown in black whereas source coil L3 may be formed in an adjacent second metal layer shown in cross-hatching. Terminal P1 is common to both coils L1 and L2. Since terminal P1 crosses over coil L1, terminal P1 may be formed in the second metal layer and connect to coils L1 and L2 through a via 130 extending between the metal layers. Coil L3 extends between terminals P4 and P3 in the second metal layer. Since terminal P4 is also common to coil L1 that is formed in the first metal layer, terminal P4 couples to coil L1 through a via 135. Terminal P2 couples to coil L2 through a via 140. A mutual inductance K12 (coupling) exists between coil L1 and coil L2. Similarly, a mutual inductance K13 exists between coil L1 and coil L3. Finally, a mutual inductance K23 exists between coil L2 and coil L3. In one implementation, each of these mutual inductances may be approximately 0.3 but it will be appreciated that other values for the mutual inductances may be used in alternative implementations. Coil L3' is not shown in FIG. 1C for illustration clarity but may be constructed analogously as discussed for coil L3.

Figure 2A:
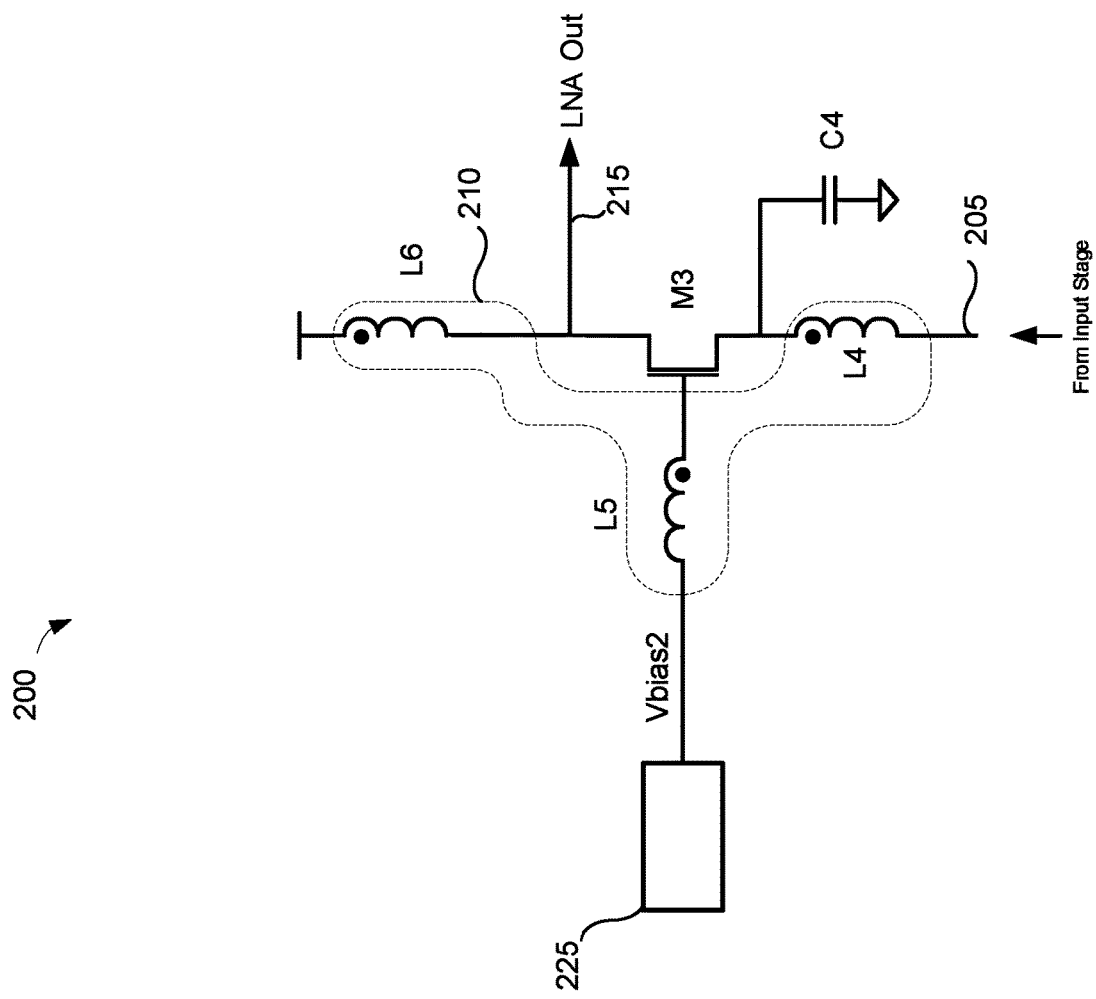
FIG. 2A illustrates a second stage of a wideband amplifier in accordance with an aspect of the disclosure.

A second stage 200 shown in FIG. 2A will now be discussed. Note that first stage 100 may be combined with other implementations of a second stage or may be used alone in alternative implementations. Second stage 200 is also denoted herein as an output stage 200. Output node 115 of first stage 100 functions as an input node 205 to output stage 200. An output transformer 210 includes a coil L4 that couples between input node 205 and a source of an NMOS output transistor M3. Coil L4 is mutually coupled to a coil L5 at the gate of output transistor M3 and a coil L6 at a drain of output transistor M3. A capacitor C4 couples between the source of output transistor M3 and ground to provide an AC ground to the source of output transistor M3. Coil L6 couples between a node for a fixed voltage reference such as a power supply voltage and the drain of output transistor M3. In a PMOS embodiment for the output transistor M3, the fixed voltage reference for coil L6 may be ground as opposed to equaling the power supply voltage in an NMOS embodiment. A voltage source 225 biases the gate of output transistor M3 through coil L5 with a positive bias voltage Vbias2 that may be less than the power supply voltage.

The coupling between coil L5 and coil L4 functions to match an input impedance of the second stage 200 to an output impedance of first stage 100. The coupling between coils L5 and coil L6 is quite advantageous with regard to enhancing stability that may otherwise be disturbed due to a parasitic gate-to-drain capacitance of transistor M3. The cascode transistors M2-M2''' in first stage 100 provide a similar stability enhancement to address an instability that may arise from the parasitic gate-to-drain capacitance of the corresponding transconductance transistors M1-M1'''. To accommodate a relatively low-value for the power supply voltage (e.g., 1.2 V) to lower power consumption, there may not be enough headroom in the second stage 200 to place a cascode transistor at the drain of output transistor M3. Output transformer 210 thus advantageously enhances stability of a low-noise amplifier formed by the combination of the first stage 100 and second stage 200 despite the lack of a cascode transistor in second stage 200. In this fashion, a relatively-low value for the power supply voltage is accommodated to reduce the power consumption. However, it will be appreciated that a cascode transistor may be included in second stage 200 in alternative implementations.

Figure 2B:
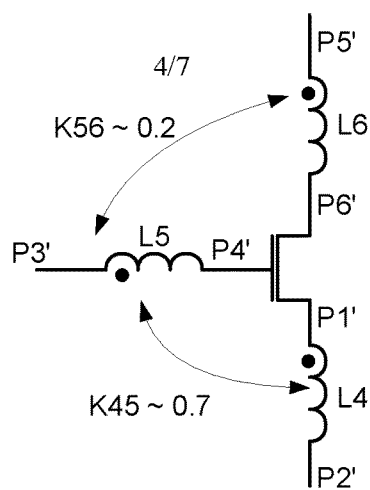
FIG. 2B illustrates a terminal labeling and the mutual inductances of the output transformer in the second stage of FIG. 2A in accordance with an aspect of the disclosure.
Figure 2C:
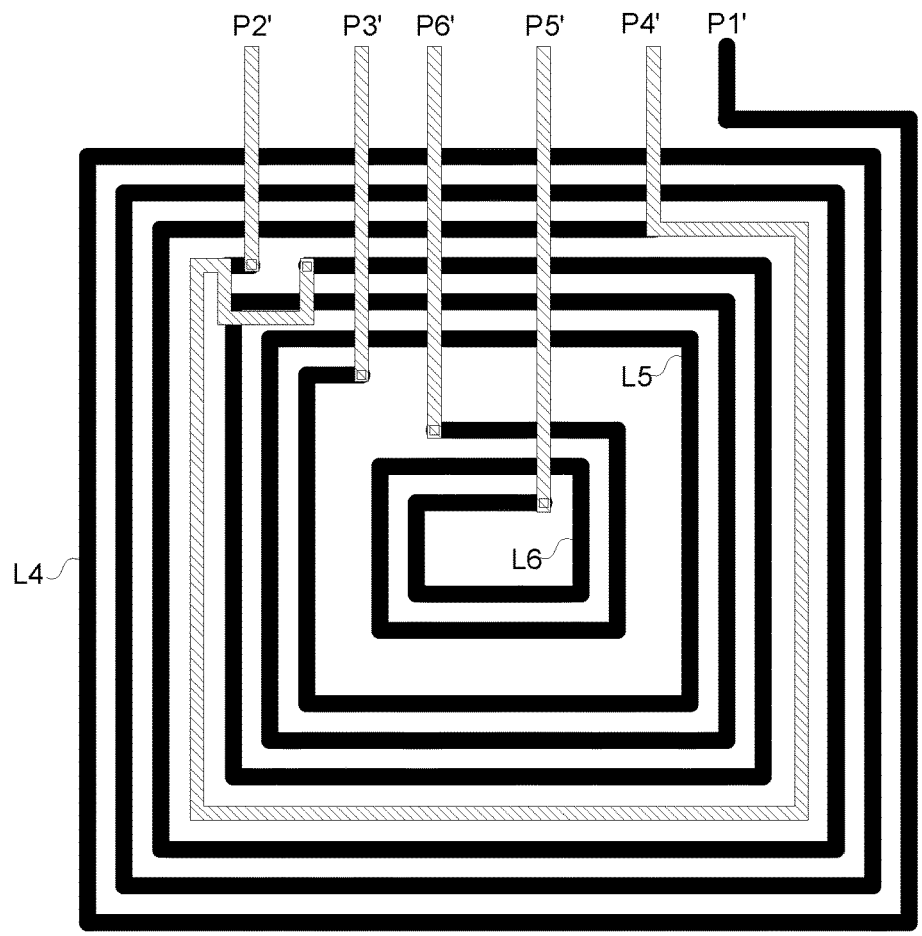
FIG. 2C illustrates a metal layer routing for the coils in the output transformer of FIG. 2A in accordance with an aspect of the disclosure.

Output transformer 210 may be formed in the metal layers adjacent to or integrated with the semiconductor die in which second stage 200 is integrated in an analogous fashion as discussed for input transformer. For output transformer 210, a set of terminals P1', P2', P3', P4', and P5' to coils L1, L2, and L3 may be labelled as shown in FIG. 2B. A resulting metal-layer coil arrangement for output transformer 210 may be as shown in FIG. 2C. Coils L4, L5, and L6 and terminal P1' are formed in one metal layer shown in black whereas terminals P2', P3', P4', P5', and P6' may be formed in an adjacent second metal layer shown in cross-hatching. From terminal P1', coil L4 coils clockwise in increasingly smaller coils to couple to terminal P2' through a via. Terminal P3' couples through a via to a beginning of an inner-most coil of coil L5. Coil L5 coils counter-clockwise from its via connection to terminal P3' in increasingly larger coils to a via connecting it to terminal P4'. Coil L6 lies within the coils of coil L5. Terminal P6' connects through a via to an outermost coil of coil L5, which then coils in a clockwise direction in increasingly smaller coils to a via to connect to terminal P5'. A mutual inductance K45 (coupling)

exists between coil L4 and coil L5 and may equal approximately 0.7 in some implementations. Similarly, a mutual inductance K56 exists between coil L5 and coil L6 that may equal approximately 0.2 in some implementations. It will be appreciated, however, that other values for the mutual inductances may be used in alternative implementations.

Figure 3A:
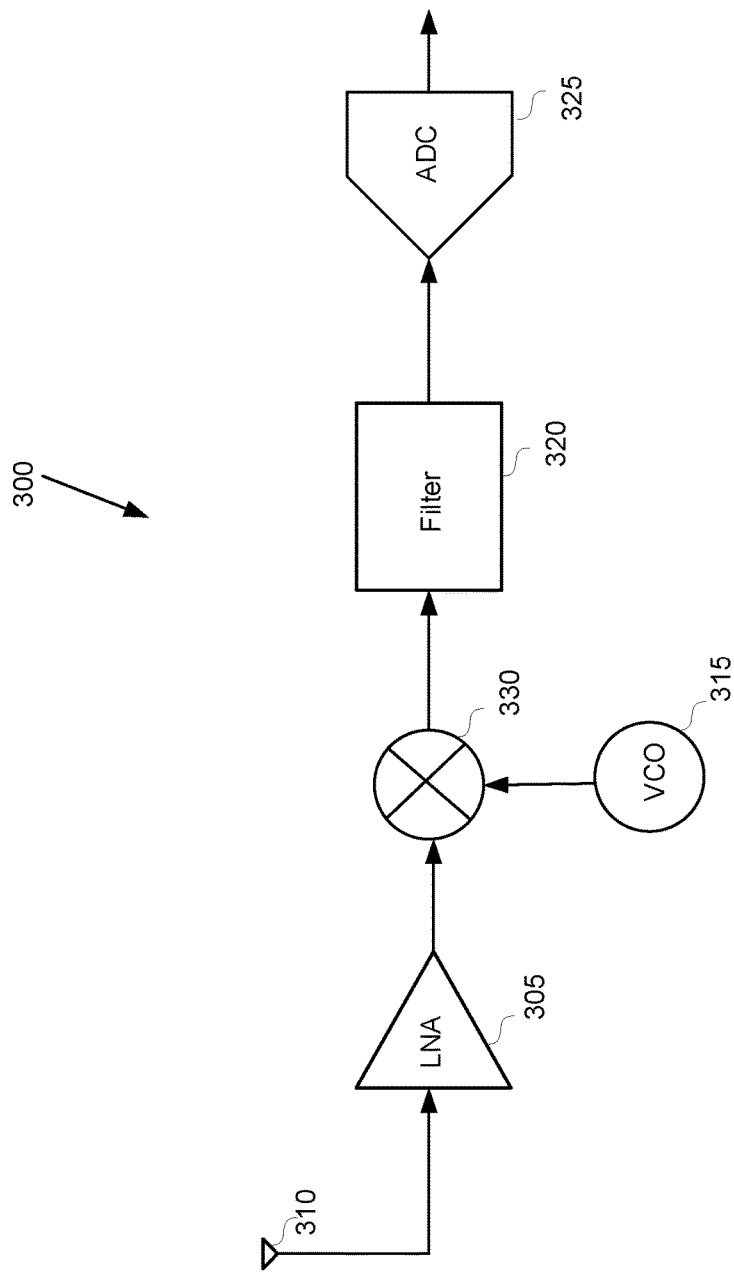
FIG. 3A illustrates a receiver incorporating a broadband low-noise amplifier in accordance with an aspect of the disclosure.

A wideband amplifier such as formed by a combination of first stage 100 and second stage 200 may be used as a low-noise amplifier (LNA) in any suitable receiver architecture. An example cellular telephone receiver 300 (which may also be applicable to other suitable receiver architectures such as WLAN or other WWAN systems) is shown in FIG. 3A. A wideband LNA 305 includes a first stage and a second stage arranged as disclosed herein. LNA 305 amplifies an input voltage signal such as produced by a received RF signal from an antenna 310 (or antennas). An output voltage signal from LNA 305 is mixed in a mixer 330 with a local oscillator signal such as from a voltage-controlled oscillator (VCO) 315 to produce an analog baseband signal that is filtered by a filter 320 before being digitized by an analog-to-digital converter (ADC) 325 to form a digital baseband signal. Filter 320 may instead be implemented in the digital domain downstream from ADC 325 as known in the receiver arts.

Figure 3B:
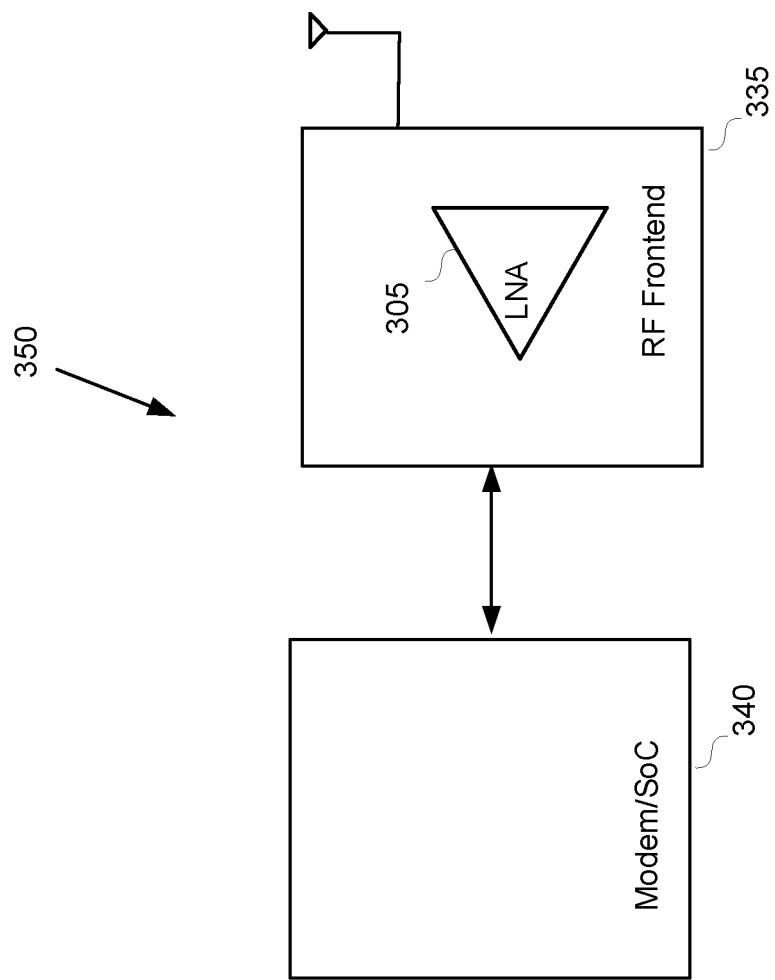
FIG. 3B illustrates a cellular telephone incorporating a broadband low-noise amplifier in accordance with an aspect of the disclosure.

A receiver with an LNA as disclosed herein may be integrated into a transceiver RF frontend circuit 335 within a cellular telephone 350 as shown in FIG. 3B. Transceiver RF frontend circuit 335 converts a digital baseband signal from a modem 340 into an RF signal for transmission to a remote network node such as a base station (not illustrated). Transceiver RF frontend circuit 335 also functions to convert a received RF signal into a digital baseband signal for modem 340. In some implementations, modem 340 may also be integrated within a system-on-a-chip (SoC). It will be appreciated that an LNA as disclosed herein may be included within an RF frontend integrated circuit that is distinct from a transceiver integrated circuit.

A method of first stage amplification will now be discussed with reference to the flowchart of FIG. 4. The method includes an act 400 of driving an input node with an input signal to cause a first current to flow through a first coil coupled between the input node and a node for a reference voltage. In addition, the method includes an act 405 that is responsive to the first current and includes coupling between the first coil and a second coil coupled between the input node and a gate of a transconductance transistor, wherein the coupling between the first coil and the second coil and the driving of the input node with the input signal causes a second current to flow through the second coil to charge the gate of the transconductance transistor. The method also includes an act 410 that is also responsive to the first current and includes coupling between the first coil and a third coil coupled to a source of the transconductance transistor and the node for the reference voltage to cause a third current to flow through the third coil. Finally, the method includes an act 415 of wherein the coupling between the first coil and the second coil in conjunction with a capacitance of the input node low pass filters the input signal and wherein the coupling between the first coil and the second coil in conjunction with a gate-to-source capacitance of the transconductance transistor high pass filters the input signal.

The disclosure will now be summarized through a series of clauses:

Clause 1. An amplifier, comprising:
an input transformer including a first coil, a second coil, and a third coil, the second coil being coupled to an input node configured to receive an input signal;
a first transconductance transistor having a gate coupled to the input node through the second coil and having a source coupled to the third coil;
an output transistor;
an output transformer having a fourth coil coupled to a source of the output transistor; a fifth coil coupled to a gate of the output transistor; and a sixth coil coupled to a drain of the output transistor; and
a first cascode transistor coupled between a drain of the first transconductance transistor and the fourth coil.

Clause 2. The amplifier of clause 1, further comprising:
a capacitor coupled between the source of the output transistor and ground.

Clause 3. The amplifier of any of clauses 1-2, wherein the first coil is coupled between the input node and ground.

Clause 4. The amplifier of clause 3, further comprising:
a voltage source configured to bias a first terminal of the fifth coil with a bias voltage, wherein a second terminal of the firth coil is coupled to the gate of the output transistor.

Clause 5. The amplifier of any of clauses 1-4, wherein the first transconductance transistor, the first cascode transistor, and the output transistor are integrated into a semiconductor die.

Clause 6. The amplifier of any of clause 5, wherein the first coil and the second coil share a first terminal, the second coil has a second terminal connected to the gate of the first transconductance transistor, the third coil has a third terminal connected to the source of the first transconductance transistor, and the first coil and the third coil both share a fourth terminal connected to ground.

Clause 7. The amplifier of clause 6, wherein the first terminal, the second terminal, the third terminal, and the fourth terminal are implemented in a first metal layer, and wherein the first coil, the second coil, and the third coil are implemented in a second metal layer that is adjacent to the first metal layer.

Clause 8. The amplifier of any of clauses 5-7, wherein the fifth coil is contained within the fourth coil, and the sixth coil is contained within the fifth coil.

Clause 9. The amplifier of any of clauses 1-8, wherein the first transconductance transistor, the first cascode transistor, and the output transistor all comprises n-type metal-oxide semiconductor (NMOS) transistors.

Clause 10. The amplifier of clause 9, wherein a first terminal of the sixth coil is coupled to a node for a power supply voltage, and wherein a second terminal of the sixth coil is coupled to the drain of the output transistor.

Clause 11. The amplifier of any of clauses 1-10, wherein the drain of the output transistor comprises an output node of the amplifier.

Clause 12. The amplifier of clause 11, wherein the amplifier comprises a low-noise amplifier integrated within a receiver comprising:
a mixer coupled to the output node of the amplifier; and
an analog-to-digital converter coupled to an output node of the mixer.

Clause 13. The amplifier of clause of any of clauses 1-12, further comprising:
a second transconductance transistor having a gate coupled to the input node through the second coil and having a source coupled to the third coil; and
a second cascode transistor coupled between a drain of the second transconductance transistor and the fourth coil.

Clause 14. The amplifier of any of clauses 1-13, further comprising:

a plurality of electrostatic discharge diodes coupled to the input node.

Clause 15. A method of amplifying an input signal, comprising:
coupling an input signal through three mutually-coupled coils of an input transformer to cause a transconductance transistor to conduct a current through a cascode transistor; and
conducting the current through an output transformer to produce an output signal at a drain of an output transistor.

Clause 16. The method of clause 15, wherein conducting the current through the output transformer comprises:
conducting the current through a first coil of the output transformer, the first coil being coupled between the cascode transistor and a source of the output transistor;
coupling the current from the first coil of the output transformer to a second coil of the output transformer, the second coil being coupled to a gate of the output transistor; and
coupling a current from the second coil of the output transformer to a third coil of the output transformer, the third coil being coupled to the drain of the output transistor.

Clause 17. The method of clause 16, further comprising:
biasing a first terminal of the third coil with a power supply voltage; and
biasing a first terminal of the second coil with a bias voltage, wherein a second terminal of the second coil is coupled to the gate of the output transistor.

Clause 18. The method of any of clauses 15-17, further comprising:
AC grounding the source of the output transistor.

Clause 19. A first stage of an amplifier, comprising;
a first transconductance transistor;
a first coil coupled between the input node and a node for a reference voltage;
a second coil coupled between an input node and a gate of the first transconductance transistor;
a third coil coupled between a source of the first transconductance transistor and the node for the reference voltage, wherein the first coil, the second coil, and the third coil are all mutually coupled to form an input transformer; and
an input capacitor coupled between the input node and ground, the input capacitor being configured with the second coil to form a low-pass filter, wherein the first coil and a gate-to-source capacitance of the first transconductance transistor are configured to form a high-pass filter.

Clause 20. The first stage of clause 19, wherein the node for the reference voltage comprises ground.

Clause 21. The first stage of clause 20, wherein the first transconductance transistor comprises an NMOS transistor.

Clause 22. The first stage of any of clauses 19-21, further comprising:
a first cascode transistor having a source coupled to a drain of the first transconductance transistor.

Clause 23. The first stage of clause 22, further comprising:
a second transconductance transistor having a gate coupled to the second coil and having a source coupled to the third coil;
a second cascode transistor having a source connected to a drain of the second transconductance transistor, wherein a drain of the first cascode transistor and a drain of the second cascode transistor are configured to form an output node for the first stage.

Clause 24. The first stage of clause 23, further comprising:
a controller configured to selectively control a gate voltage of the first cascode transistor and a gate voltage of the second cascode transistor to adjust a gain of the first stage.

Clause 25. The first stage of any of clauses 20-24, further comprising:
a gate capacitor, wherein the second coil is configured to couple to the gate of the first transconductance transistor through the gate capacitor.

Clause 26. The first stage of any of clauses 20-25, wherein the input capacitor comprises a parasitic capacitance of a plurality of electrostatic discharge diodes.

Clause 27. A method of amplifying in a first stage of an amplifier, comprising:
driving an input node with an input signal to cause a first current to flow through a first coil coupled between the input node and a node for a reference voltage;
responsive to the first current, coupling between the first coil and a second coil coupled between the input node and a gate of a transconductance transistor, wherein the coupling between the first coil and the second coil and the driving of the input node with the input signal causes a second current to flow through the second coil to charge the gate of the transconductance transistor;
responsive to the first current, coupling between the first coil and a third coil coupled to a source of the transconductance transistor and the node for the reference voltage to cause a third current to flow through the third coil; and
wherein the coupling between the first coil and the second coil in conjunction with a capacitance of the input node low pass filters the input signal and wherein the coupling between the first coil and the second coil in conjunction with a gate-to-source capacitance of the transconductance transistor high pass filters the input signal.

Clause 28. The method of clause 27, further comprising:
conducting a current through a cascode transistor responsive to the charging of the gate of the transconductance transistor.

Clause 29. The method of any of clauses 27-28, wherein the node for the reference voltage comprises ground.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:
1. An amplifier, comprising:
an input transformer including a first coil, a second coil, and a third coil, the second coil being coupled to an input node configured to receive an input signal;
a first transconductance transistor having a gate coupled to the input node through the second coil and having a source coupled to the third coil;
an output transistor;
an output transformer including a fourth coil coupled to a source of the output transistor; a fifth coil coupled to a gate of the output transistor; and a sixth coil coupled to a drain of the output transistor; and a first cascode transistor coupled between a drain of the first transconductance transistor and the fourth coil.

2. The amplifier of claim 1, further comprising:
a capacitor coupled between the source of the output transistor and ground.

3. The amplifier of claim 1, wherein the first coil is coupled between the input node and ground.

4. The amplifier of claim 1, further comprising:
a voltage source configured to bias a first terminal of the fifth coil with a bias voltage, wherein a second terminal of the fifth coil is coupled to the gate of the output transistor.

5. The amplifier of claim 1, wherein the first transconductance transistor, the first cascode transistor, and the output transistor are integrated into a semiconductor die.

6. The amplifier of claim 5, wherein the first coil and the second coil both share a first terminal, the second coil has a second terminal connected to the gate of the first transconductance transistor, the third coil has a third terminal connected to the source of the first transconductance transistor, and the first coil and the third coil both share a fourth terminal connected to ground.

7. The amplifier of claim 6, wherein the first terminal, the second terminal, the third terminal, and the fourth terminal are implemented in a first metal layer, and wherein the first coil, the second coil, and the third coil are implemented in a second metal layer that is adjacent to the first metal layer.

8. The amplifier of claim 5, wherein the fifth coil is contained within the fourth coil, and the sixth coil is contained within the fifth coil.

9. The amplifier of claim 1, wherein the first transconductance transistor, the first cascode transistor, and the output transistor all comprises n-type metal-oxide semiconductor (NMOS) transistors.

10. The amplifier of claim 9, wherein a first terminal of the sixth coil is coupled to a node for a power supply voltage, and wherein a second terminal of the sixth coil is coupled to the drain of the output transistor.

11. The amplifier of claim 10, wherein the drain of the output transistor comprises an output node of the amplifier.

12. The amplifier of claim 11, wherein the amplifier comprises a low-noise amplifier integrated within a receiver comprising:
a mixer coupled to the output node of the amplifier; and
an analog-to-digital converter coupled to an output node of the mixer.

13. The low-noise amplifier of claim 1, further comprising:
a second transconductance transistor having a gate coupled to the input node through the second coil and having a source coupled to the third coil; and
a second cascode transistor coupled between a drain of the second transconductance transistor and the fourth coil.

14. The amplifier of claim 1, further comprising a plurality of electrostatic discharge diodes coupled to the input node.

15. A method of amplifying an input signal, comprising:
coupling the input signal through three mutually-coupled coils of an input transformer to cause a transconductance transistor to conduct a current through a cascode transistor; and
conducting the current through an output transformer to produce an output signal at a drain of an output transistor.

16. The method of claim 15, wherein conducting the current through the output transformer comprises:

conducting the current through a first coil of the output transformer, the first coil being coupled between the cascode transistor and a source of the output transistor;
coupling the current from the first coil of the output transformer to a second coil of the output transformer, the second coil being coupled to a gate of the output transistor; and
coupling a current from the second coil of the output transformer to a third coil of the output transformer, the third coil being coupled to the drain of the output transistor.

17. The method of claim 16, further comprising:
biasing a first terminal of the third coil with a power supply voltage; and
biasing a first terminal of the second coil with a bias voltage, wherein a second terminal of the second coil is coupled to the gate of the output transistor.

18. The method of claim 16, further comprising:
AC grounding the source of the output transistor.

19. A first stage of an amplifier, comprising;
an input node;
a first transconductance transistor;
a first coil coupled between the input node and a node for a reference voltage;
a second coil coupled between the input node and a gate of the first transconductance transistor;
a third coil coupled between a source of the first transconductance transistor and the node for the reference voltage, wherein the first coil, the second coil, and the third coil are all mutually coupled to form an input transformer; and
an input capacitor coupled between the input node and ground, the input capacitor being configured with the second coil to form a low-pass filter, wherein the first coil and a gate-to-source capacitance of the first transconductance transistor are configured to form a high-pass filter.

20. The first stage of claim 19, wherein the node for the reference voltage comprises ground.

21. The first stage of claim 20, wherein the first transconductance transistor comprises an NMOS transistor.

22. The first stage of claim 19, further comprising:
a first cascode transistor having a source coupled to a drain of the first transconductance transistor.

23. The first stage of claim 22, further comprising:
a second transconductance transistor having a gate coupled to the second coil and having a source coupled to the third coil;
a second cascode transistor having a source connected to a drain of the second transconductance transistor, wherein a drain of the first cascode transistor and a drain of the second cascode transistor are configured to form an output node for the first stage.

24. The first stage of claim 23, further comprising:
a controller configured to selectively control a gate voltage of the first cascode transistor and a gate voltage of the second cascode transistor to adjust a gain of the first stage.

25. The first stage of claim 20, further comprising:
a gate capacitor, wherein the second coil is configured to couple to the gate of the first transconductance transistor through the gate capacitor.

26. The first stage of claim 20, wherein the input capacitor comprises a parasitic capacitance of a plurality of electrostatic discharge diodes.

27. The first stage of claim 22, further comprising:
a load coupled to a drain of the first cascode transistor.

28. The first stage of claim 22, further comprising a second stage including:
  an output transistor;
  an output transformer including a fourth coil coupled to a source of the output transistor; a fifth coil coupled to a gate of the output transistor; and a sixth coil coupled to a drain of the output transistor, wherein the fourth coil is further coupled to the drain of the first cascode transistor.

29. The first stage of claim 28, wherein the drain of the output transistor comprises an output node of an amplifier that includes the first stage and the second stage.

30. The first stage of claim 29, wherein the amplifier comprises a low-noise amplifier integrated within a receiver comprising:
  a mixer coupled to the output node of the amplifier; and
  an analog-to-digital converter coupled to an output node of the mixer.

* * * * *